(12) United States Patent
Mikagi

(10) Patent No.: US 6,284,662 B1
(45) Date of Patent: Sep. 4, 2001

(54) METHOD OF FORMING A COBALT SILICIDE LAYER BY USE OF A TEOS THROUGH OXIDE FILM FOR ION-IMPLANTATION PROCESS

(75) Inventor: Kaoru Mikagi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/406,715

(22) Filed: Sep. 28, 1999

(30) Foreign Application Priority Data

Sep. 28, 1998 (JP) .................................................. 10-272949

(51) Int. Cl.7 .................................................. H01L 21/302
(52) U.S. Cl. ............................ 438/706; 438/721; 438/906
(58) Field of Search .................................. 438/706, 710, 438/712, 714, 715, 721, 655, 682, 906

(56) References Cited

U.S. PATENT DOCUMENTS 5,849,634 * 12/1998 Iwata ..................................... 438/655
5,899,720 * 5/1999 Mikagi ................................. 438/303
5,915,204 * 6/1999 Sumi .................................... 438/683
5,923,984 * 7/1999 Gardner et al. ...................... 438/289

* cited by examiner

Primary Examiner—Benjamin L. Utech
Assistant Examiner—Kin-Chan Chen
(74) Attorney, Agent, or Firm—Young & Thompson

(57) ABSTRACT

A method of forming a cobalt silicide layer on a silicon region comprises the steps of: forming a TEOS oxide film on a surface of the silicon region; carrying out an ion-implantation process for implanting ions through the TEOS oxide film into the silicon region; carrying out a heat treatment to activate the ions implanted in the silicon region, whereby a silicidation reaction inhibitor layer concurrently formed on an interface between the TEOS oxide film and the surface of the silicon region; carrying out a dry etching to remove laminations of the TEOS oxide film and the silicidation reaction inhibitor layer from the surface of the silicon region; carrying out a cleaning process for cleaning the surface of the silicon region by subjecting the surface of the silicon region to an acidic solution and subsequently to a diluted hydrofluoric acid solution; and forming a cobalt silicide layer on the surface of the silicon region.

36 Claims, 12 Drawing Sheets

FIG. 4

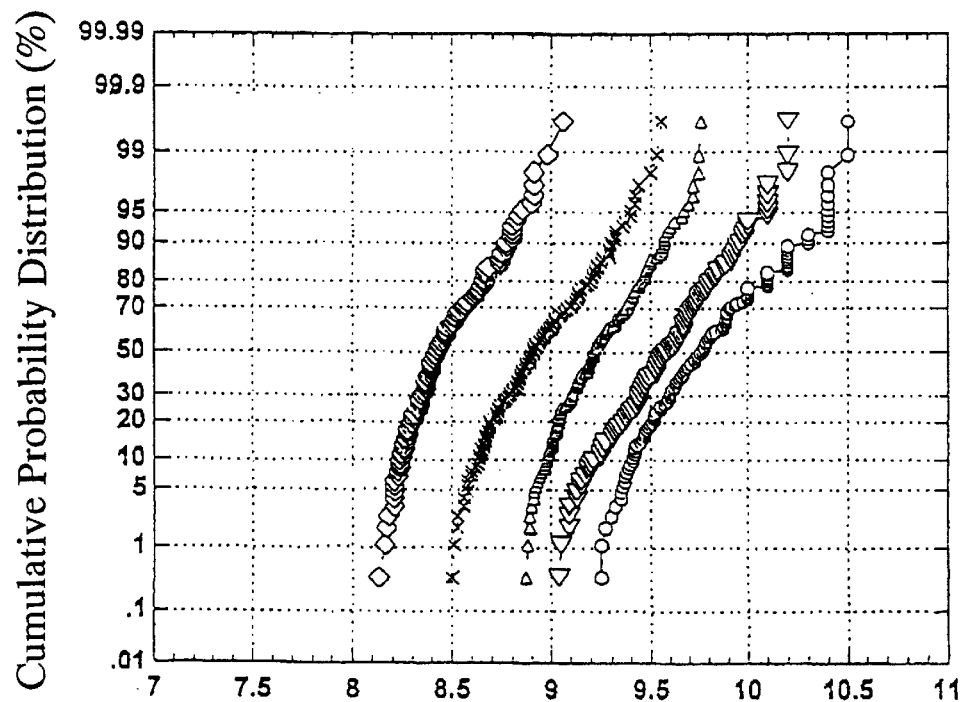

Sheet Resistance (ohms/□)

Gate size : 2.0 micrometers

○ : cleaning process prior to the plasma etching process ; the plasma etching for 30 seconds.

◇ : cleaning process prior to the plasma etching process ; the plasma etching for 75 seconds.

△ : cleaning process prior to the plasma etching process, the plasma etching for 90 seconds.

▽ : cleaning process prior to the plasma etching process ; the plasma etching for 105 seconds.

✗ : cleaning process prior to the plasma etching process ; the plasma etching for 120 seconds.

FIG. 6

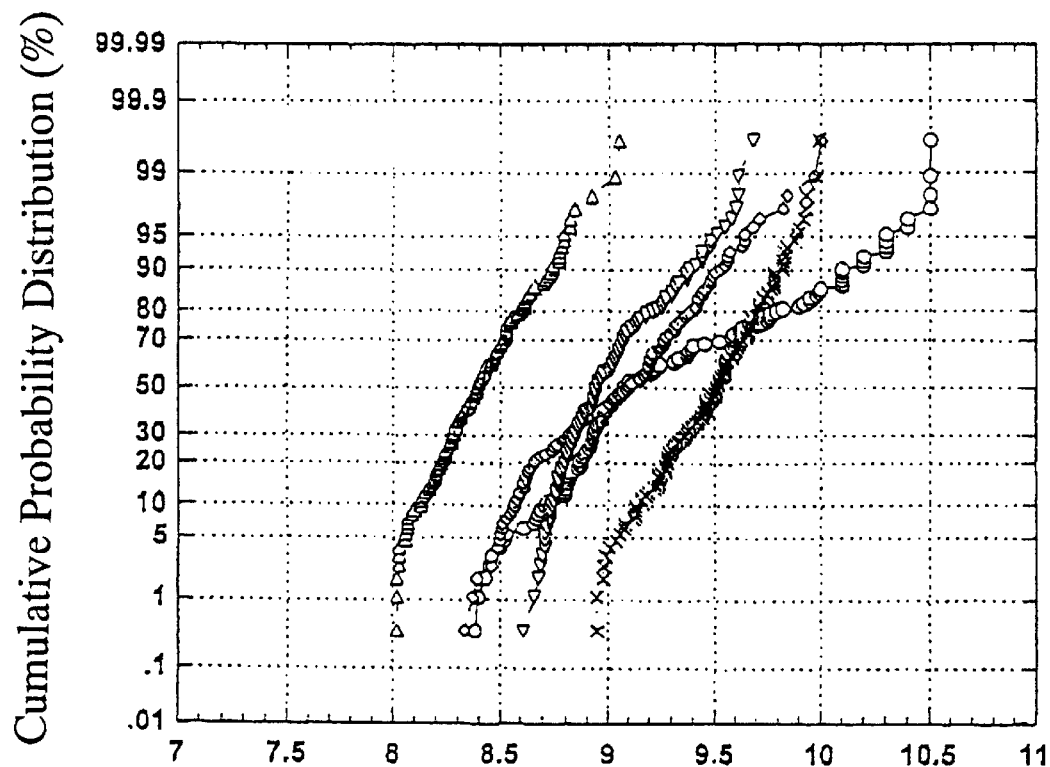

Gate size : 2.0 micrometers

◯ : no cleaning process prior to the plasma etching process ; the plasma etching for 30 seconds.

◇ : no cleaning process prior to the plasma etching process ; the plasma etching for 75 seconds.

△ : no cleaning process prior to the plasma etching process, the plasma etching for 90 seconds.

▽ : no cleaning process prior to the plasma etching process ; the plasma etching for 105 seconds.

✕ : no cleaning process prior to the plasma etching process ; the plasma etching for 120 seconds.

US 6,284,662 B1

METHOD OF FORMING A COBALT SILICIDE LAYER BY USE OF A TEOS THROUGH OXIDE FILM FOR ION-IMPLANTATION PROCESS

BACKGROUND OF THE INVENTION

The present invention relates to a method of forming a semiconductor device, and more particularly to a method of forming a cobalt silicide layer by use of a tetraethylorthosilicate oxide film as a through oxide film for ion-implantation process.

A self-aligned silicidation or a salicidation technique has been used to form self-aligned silicide layers or salicide layers on surfaces of a polysilicon gate and source and drain regions in order to reduce resistances of not only the gate electrode but also the source and drain diffusion regions. This salicidation technique is applicable to sub-micron devices.

In prior art processes already known, a through oxide film is formed over a silicon substrate with a polysilicon gate in a chemical vapor deposition method by use of $SiH_4$ based gas. An ion-implantation process is then carried out to selectively form source and drain regions for subsequent rapid thermal anneal for activation of the source and drain regions. Further, the used through oxide film is removed by use of a hydrofluoric acid based solution before a cobalt silicidation process is then carried out to form cobalt silicide layers on surfaces of the polysilicon gate and the source and drain regions. If an $SiH_4$ based CVD oxide film is used as the through oxide film, then an Si—O based layer is formed over a surface of the substrate by the ion-implantation and subsequent rapid thermal anneal. Such the unnecessary Si—O based layer is, however, removable together with the through oxide film by the wet etching process using the hydrofluoric acid solution, resulting in a clean silicon surface appearing.

In order to have improved throughput, it has been proposed to use a tetraethylorthosilicate oxide film (SiO2) as the through oxide film, wherein the tetraethylorthosilicate oxide film (SiO2) is formed in a low pressure chemical vapor deposition method using tetraethylorthosilicate as a source. Tetraethylorthosilicate will hereinafter be referred to as TEOS. A large amount of carbon toms in the TEOS oxide film, for which reason not only oxygen but also carbon are introduced into the substrate by knock-on. The introduction of ot only oxygen but carbon into the substrate results in a formation of an Si—O—C based layer over the silicon substrate surface by the rapid thermal anneal for the activation to the source and drain regions, wherein the Si—O—C based layer is unremovable by the above wet etching process using the hydrofluoric acid based solution.

This residual Si—O—C based layer causes a problem that oxygen and carbon inhibit cobalt-silicidation reaction between cobalt and silicon atoms. Namely, oxygen and carbon serve as cobalt silicidation inhibitors.

The above problem will be described in more detail with reference to the drawings. FIG. 1A is a fragmentary cross sectional elevation view illustrative of a MOS field effect transistor after an ion-implantation process and subsequent rapid thermal anneal for activation to source and drain regions have been carried out. FIG. 1B is a fragmentary cross sectional elevation view illustrative of a MOS field effect transistor after a TEOS oxide film has been removed by a wet etching process using a diluted hydrofluoric acid solution.

With reference to FIG. 1A, source and drain regions 12 and 14 are selectively provided in a silicon substrate 10, whereby a channel region is defined between the source and drain regions 12 and 14. A gate oxide film 18 is formed on the channel region of the silicon substrate 10. A polysilicon gate electrode 16 is provided on the gate oxide film 18. Side wall oxide films 20 are also provided on side walls of the polysilicon gate electrode 16. Under the side wall oxide films 20, the source and drain regions 12 and 14 are lightly doped regions. A TEOS oxide film 22 as a through oxide film entirely extends on a top surface of the polysilicon gate electrode 16, and on the side wall oxide films as well as on top surfaces of the source and drain regions 12 and 14. In the rapid thermal anneal for activation of the source and drain regions 12 and 14, oxygen and carbon included in the TEOS oxide film are knocked-on and introduced into surface regions of the polysilicon gate electrode 16, and the source and drain regions 12 and 14, whereby an Si—O—C based reaction inhibitor layer 24 is formed on the surfaces of the polysilicon gate electrode 16, and the source and drain regions 12 and 14.

In order to remove the contaminant on the surface of the TEOS oxide film 22, a cleaning process is carried out by use of an acid solution such as a sulfate-hydrogen peroxide solution or an ammonium-hydrogen peroxide solution for subsequent wet etching process using a diluted hydrofluoric acid solution with a diluting ratio of 1:100. This wet etching is carried out in order to remove the TEOS oxide film 22. The cleaning process and the subsequent wet etching process are unable to realize a complete removal of the Si—O—C based reaction inhibitor layer 24. Namely, the Si—O—C based reaction inhibitor layer 24 resides on the surfaces of the polysilicon gate, and the source and drain regions. Subsequently, a Co film having a thickness of 100 angstroms is deposited on the residual Si—O—C based reaction inhibitor layer 24 by sputtering Co target at a temperature of 400° C., so that a silicidation reaction is caused on an interface between the Co film and the surface of the polysilicon gate electrode and also on interfaces between the Co film and the surfaces of the source and drain regions, whereby a cobalt silicide layer ($CoSi_2$) is formed on the surfaces of the polysilicon gate electrode and the source and drain regions. This cobalt silicide layer, however, has a high sheet resistance of about 100 Ω/□. The cobalt silicide layer also has a thickness of not more than 100 angstroms which is much thinner than the intended or necessary thickness in the range of 300–350 angstroms. The higher sheet resistance and the thinner thickness of the actually cobalt silicide layer means that the residual Si—O—C based reaction inhibitor layer 24 inhibits the cobalt silicidation reaction.

In the above circumstances, it had been required to develop a novel method of forming a cobalt silicide layer free from the above problem.

SUMMARY OF THE INVENTION

Accordingly, it is an object of the present invention to provide a novel method of forming a cobalt silicide layer free from the above problems.

It is a further object of the present invention to provide a novel method of forming a cobalt silicide layer without any inhibition to cobalt silicidation reaction after a TEOS oxide layer has been used as a through oxide layer for ion-implantation process.

It is a still further object of the present invention to provide a novel method of forming a cobalt silicide layer having a reduced sheet resistance.

It is yet a further object of the present invention to provide a novel method of causing a cobalt silicidation reaction without any substantive inhibition even after a TEOS oxide layer has been used as a through oxide layer for ion-implantation process.

It is a further more object of the present invention to provide a method of forming a semiconductor device which has a cobalt silicide layer with a reduced sheet resistance.

It is moreover object of the present invention to provide a method of forming a field effect transistor which has a cobalt silicide layer with a reduced sheet resistance.

The present invention provides a method of forming a cobalt silicide layer on a silicon region. The method comprises the steps of: forming a TEOS oxide film on a surface of the silicon region; carrying out an ion-implantation process for implanting ions through the TEOS oxide film into the silicon region; carrying out a heat treatment to activate the ions implanted in the silicon region, whereby a silicidation reaction inhibitor layer is concurrently formed on an interface between the TEOS oxide film and the surface of the silicon region; carrying out a dry etching to remove laminations of the TEOS oxide film and the silicidation reaction inhibitor layer from the surface of the silicon region; carrying out a cleaning process for cleaning the surface of the silicon region by subjecting the surface of the silicon region to an acidic solution and subsequently to a diluted hydrofluoric acid solution; and forming a cobalt silicide layer on the surface of the silicon region.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

FIG. 4 is a diagram illustrative of the found cumulative probability distribution in sheet resistance of the cobalt silicide layer as formed in the novel process shown in FIG. 3 in a first embodiment in accordance with the present invention.

FIG. 6 is a diagram illustrative of the found cumulative probability distribution in sheet resistance of the cobalt silicide layer as formed in the novel process shown in FIG. 5, wherein gate size is set to be 2.0 micrometers in a second embodiment in accordance with the present invention.

DISCLOSURE OF THE INVENTION

Figure 1A:
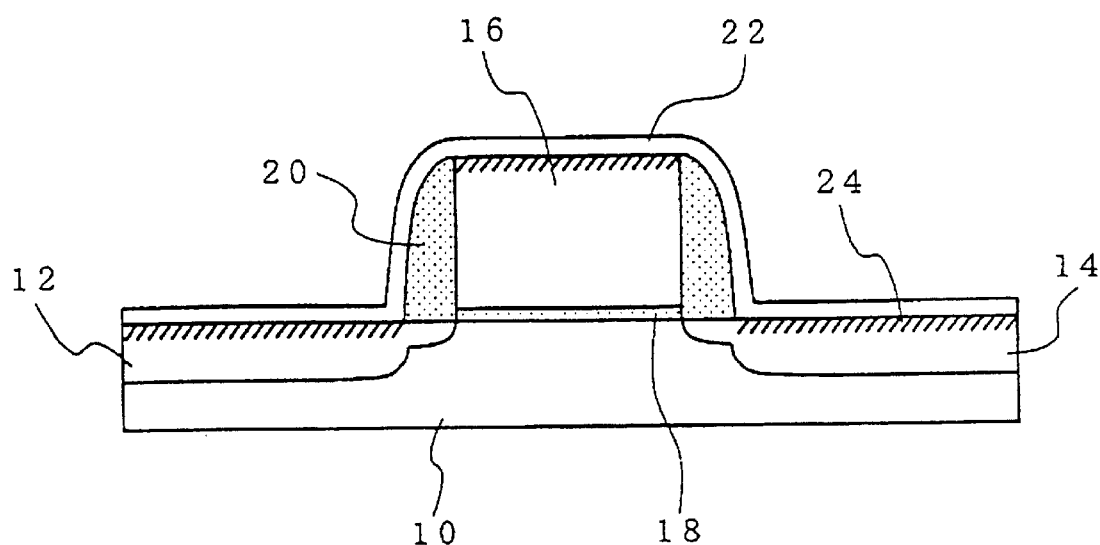
FIG. 1A is a fragmentary cross sectional elevation view illustrative of a MOS field effect transistor after an ion-implantation process and subsequent rapid thermal anneal for activation to source and drain regions have been carried out.
Figure 1B:
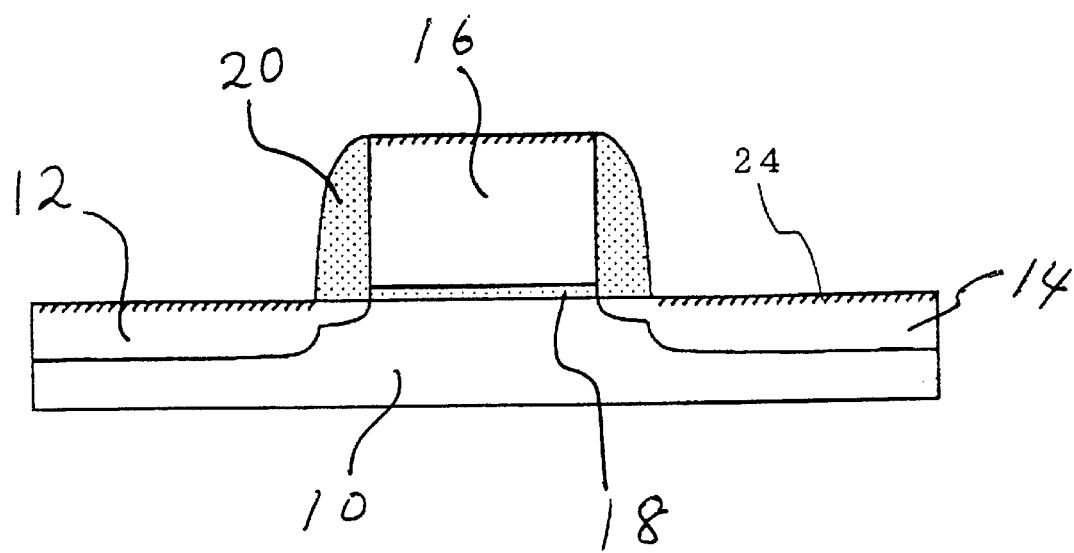
FIG. 1B is a fragmentary cross sectional elevation view illustrative of a MOS field effect transistor after a TEOS oxide film has been removed by an wet etching process using a diluted hydrofluoric acid solution.

The first present invention provides a method of removing a silicidation reaction inhibitor layer from a surface of a silicon region for subsequent silicidation reaction, wherein the method comprises the step of carrying out a dry etching to the silicidation reaction inhibitor layer.

The dry etching process causes a sufficient removal of the silicidation reaction inhibitor layer from the surfaces of the silicon region, thereby ensuring that a cobalt silicide layer having superior and desirable properties is formed on the surface of the silicon region. The dry etching process causes that the silicide layer has a sufficiently reduced sheet resistance and a sufficiently reduced variation in sheet resistance.

It is preferable that the method further comprises the step of carrying out a cleaning process for cleaning the surface by subjecting the surface to an acidic solution after the silicidation reaction inhibitor layer has been removed by the dry etching process.

It is further preferable that any one of a sulfate-hydrogen peroxide solution and an ammonium-hydrogen peroxide solution is used as the acidic solution.

It is also preferable that the cleaning process further comprises the step of subjecting the surface to a diluted hydrofluoric acid solution after the surface has been subjected to the acidic solution.

It is also preferable that the dry etching comprises a plasma etching.

It is further preferable that the plasma etching is carried out by use of at least any one selected from the group consisting of $CF_4$, $C_2F_6$, $SF_6$ gases and mixture gases of $O_2$ with $CF_4$, $C_2F_6$, and $SF_6$.

It is also preferable that the method further comprises the step of subjecting the surface to an $O_2$ plasma after the silicidation reaction inhibitor layer has been removed by the dry etching process. This plasma treatment is carried out by use of the plasma etching system having used for the plasma etching process in the previous step. The plasma treatment is carried out using $O_2$ plasma in order to remove contaminants such as polymer from the surfaces of the silicon region, wherein the contaminants such as polymer have been adhered by the previous dry etching process on the surface of the silicon region. A degree of clean of the top surface of the silicon region is of course higher than when no plasma treatment is carried out, for which reason the effects of this plasma treatment are superior than the effects of no plasma treatment. Namely, the plasma etching causes that the cobalt silicide layer has a sufficiently reduced sheet resistance and a sufficiently reduced variation in sheet resistance. A degree of variation of in sheet resistance of the cobalt silicide layer for individual conditions is not so different from each other. The dry etching process mentioned above causes a sufficient removal of the silicidation reaction inhibitor layer from the surface of the silicon region, thereby ensuring that a cobalt silicide layer having superior and desirable properties is formed on the surface of the silicon region.

The second present invention provides a method of removing laminations of a TEOS oxide film and a silicidation reaction inhibitor layer from a surface of a silicon region for subsequent cobalt silicidation reaction, wherein the method comprises the step of carrying out a dry etching to the laminations of the TEOS oxide film and the silicidation reaction inhibitor layer.

The dry etching process causes a sufficient removal of the silicidation reaction inhibitor layer from the surfaces of the silicon region, thereby ensuring that a cobalt silicide layer having superior and desirable properties is formed on the surface of the silicon region. The dry etching process causes that the cobalt silicide layer has a sufficiently reduced sheet resistance and a sufficiently reduced variation in sheet resistance.

It is preferable that the method further comprises the step of carrying out a cleaning process for cleaning the surface by subjecting the surface to an acidic solution after the laminations of the TEOS oxide film and the silicidation reaction inhibitor layer have been removed by the dry etching process.

It is further preferable that any one of a sulfate-hydrogen peroxide solution and an ammonium-hydrogen peroxide solution is used as the acidic solution.

It is also preferable that the cleaning process further comprises the step of subjecting the surface to a diluted hydrofluoric acid solution after the surface has been subjected to the acidic solution.

It is also preferable that the dry etching comprises a plasma etching.

It is further preferable that the plasma etching is carried out by use of at least any one selected from the group consisting of $CF_4$, $C_2F_6$, $SF_6$ gases and mixture gases of $O_2$ with $CF_4$, $C_2F_6$, and $SF_6$.

It is also preferable that the method further comprises the step of subjecting the surface to an $O_2$ plasma after the laminations of the TEOS oxide film and the silicidation reaction inhibitor layer have been removed by the dry etching process. This plasma treatment is carried out by use of the plasma etching system having used for the plasma etching process in the previous step. The plasma treatment is carried out using $O_2$ plasma in order to remove contaminants such as polymer from the surfaces of the silicon region, wherein the contaminants such as polymer have been adhered by the previous dry etching process on the surface of the silicon region. A degree of clean of the top surface of the silicon region is of course higher than when no plasma treatment is carried out, for which reason the effects of this plasma treatment are superior than the effects of no plasma treatment. Namely, the plasma etching causes that the cobalt silicide layer has a sufficiently reduced sheet resistance and a sufficiently reduced variation in sheet resistance. A degree of variation of in sheet resistance of the cobalt silicide layer for individual conditions is not so different from each other. The dry etching process mentioned above causes a sufficient removal of the silicidation reaction inhibitor layer from the surface of the silicon region, thereby ensuring that a cobalt silicide layer having superior and desirable properties is formed on the surface of the silicon region.

The third present invention provides a method of forming a cobalt silicide layer on a surface of a silicon region, wherein the method comprises the steps of: carrying out a dry etching to remove laminations of a TEOS oxide film and a silicidation reaction inhibitor layer from a surface of the silicon region; and forming a cobalt silicide layer on the surface of the silicon region.

The dry etching process causes a sufficient removal of the silicidation reaction inhibitor layer from the surfaces of the silicon region, thereby ensuring that a cobalt silicide layer having superior and desirable properties is formed on the surface of the silicon region. The dry etching process causes that the cobalt silicide layer has a sufficiently reduced sheet resistance and a sufficiently reduced variation in sheet resistance.

It is preferable that the method further comprises the step of carrying out a cleaning process for cleaning the surface by subjecting the surface of the silicon region to an acidic solution after the laminations of the TEOS oxide film and the silicidation reaction inhibitor layer have been removed by the dry etching process and before the cobalt silicide layer is formed.

It is further preferable that any one of a sulfate-hydrogen peroxide solution and an ammonium-hydrogen peroxide solution is used as the acidic solution.

It is also preferable that the cleaning process further comprises the step of subjecting the surface to a diluted hydrofluoric acid solution after the surface has been subjected to the acidic solution.

It is also preferable that the dry etching comprises a plasma etching.

It is further preferable that the plasma etching is carried out by use of at least any one selected from the group consisting of $CF_4$, $C_2F_6$, $SF_6$ gases and mixture gases of $O_2$ with $CF_4$, $C_2F_6$, and $SF_6$.

It is also preferable that the method further comprises the step of subjecting the surface to an $O_2$ plasma after the laminations of the TEOS oxide film and the silicidation reaction inhibitor layer have been removed by the dry etching process and before the cobalt silicide layer is formed. This plasma treatment is carried out by use of the plasma etching system having used for the plasma etching process in the previous step. The plasma treatment is carried out using $O_2$ plasma in order to remove contaminants such as polymer from the surfaces of the silicon region, wherein the contaminants such as polymer have been adhered by the previous dry etching process on the surface of the silicon region. A degree of clean of the top surface of the silicon region is of course higher than when no plasma treatment is carried out, for which reason the effects of this plasma treatment are superior than the effects of no plasma treatment. Namely, the plasma etching causes that the cobalt silicide layer has a sufficiently reduced sheet resistance and a sufficiently reduced variation in sheet resistance. A degree of variation of in sheet resistance of the cobalt silicide layer for individual conditions is not so different from each other. The dry etching process mentioned above causes a sufficient removal of the silicidation reaction inhibitor layer from the surface of the silicon region, thereby ensuring that a cobalt silicide layer having superior and desirable properties is formed on the surface of the silicon region.

It is also preferable that the method further comprises the step of an additional cleaning process by subjecting a surface of the TEOS oxide film to an additional acidic solution before the laminations of the TEOS oxide film and the silicidation reaction inhibitor layer are removed by the dry etching process.

It is further preferable that any one of a sulfate-hydrogen peroxide solution and an ammonium-hydrogen peroxide solution is used as the additional acidic solution.

It is also preferable that the surface of the TEOS oxide film so remains subjected to the additional acidic solution until not only the surface of the TEOS oxide film is cleaned but also a surface part of the TEOS oxide film is removed by the wet etching, before a remaining part of the TEOS oxide film and the silicidation reaction inhibitor layer are removed by the dry etching process. Namely, the cleaning process is so carried out by a wet etching not only to clean the top surface of the TEOS through oxide layer but also to etch a surface portion of the TEOS through oxide layer, so as to shorten the time for carrying out the subsequent plasma etching process. The plasma etching is capable of etching not only the TEOS through oxide layer and the silicidation reaction inhibitor layer but also surface portion of the silicon region. Particularly when the silicon region has an extremely shallow p-n junction for scaling down the semiconductor device, a long time plasma etching makes it difficult to surely prevent any substantive over-etching to the surface portion of the silicon region. In order to prevent such a long time plasma etching, the cleaning process is so carried out to wet-etch surface portions of the TEOS through oxide layer.

The fourth present invention provides a method of forming a cobalt silicide layer on a silicon region. The method comprises the steps of: forming a TEOS oxide film on a surface of the silicon region; carrying out an ion-implantation process for implanting ions through the TEOS oxide film into the silicon region; carrying out a heat treatment to activate the ions implanted in the silicon region, whereby a silicidation reaction inhibitor layer is concurrently formed on an interface between the TEOS oxide film and the surface of the silicon region; carrying out a dry etching to remove laminations of the TEOS oxide film and the silicidation reaction inhibitor layer from the surface of the silicon region; carrying out a cleaning process for cleaning the surface of the silicon region by subjecting the surface of the silicon region to an acidic solution and subsequently to a diluted hydrofluoric acid solution; and forming a cobalt silicide layer on the surface of the silicon region.

The dry etching process causes a sufficient removal of the silicidation reaction inhibitor layer from the surfaces of the silicon region, thereby ensuring that a cobalt silicide layer having superior and desirable properties is formed on the surface of the silicon region. The dry etching process causes that the cobalt silicide layer has a sufficiently reduced sheet resistance and a sufficiently reduced variation in sheet resistance.

It is preferable that any one of a sulfate-hydrogen peroxide solution and an ammonium-hydrogen peroxide solution is used as the acidic solution.

It is also preferable that the dry etching comprises a plasma etching.

It is further preferable that the plasma etching is carried out by use of at least any one selected from the group consisting of $CF_4$, $C_2F_6$, $SF_6$ gases and mixture gases of $O_2$ with $CF_4$, $C_2F_6$, and $SF_6$.

It is also preferable that the method further comprises the step of subjecting the surface to an $O_2$ plasma after the laminations of the TEOS oxide film and the silicidation reaction inhibitor layer have been removed by the dry etching process and before the cobalt silicide layer is formed. This plasma treatment is carried out by use of the plasma etching system having used for the plasma etching process in the previous step. The plasma treatment is carried out using $O_2$ plasma in order to remove contaminants such as polymer from the surfaces of the silicon region, wherein the contaminants such as polymer have been adhered by the previous dry etching process on the surface of the silicon region. A degree of clean of the top surface of the silicon region is of course higher than when no plasma treatment is carried out, for which reason the effects of this plasma treatment are superior than the effects of no plasma treatment. Namely, the plasma etching causes that the cobalt silicide layer has a sufficiently reduced sheet resistance and a sufficiently reduced variation in sheet resistance. A degree of variation of in sheet resistance of the cobalt silicide layer for individual conditions is not so different from each other. The dry etching process mentioned above causes a sufficient removal of the silicidation reaction inhibitor layer from the surface of the silicon region, thereby ensuring that a cobalt silicide layer having superior and desirable properties is formed on the surface of the silicon region.

It is also preferable that the method further comprises the step of an additional cleaning process by subjecting a surface of the TEOS oxide film to an additional acidic solution before the laminations of the TEOS oxide film and the silicidation reaction inhibitor layer are removed by the dry etching process.

It is also preferable that any one of a sulfate-hydrogen peroxide solution and an ammonium-hydrogen peroxide solution is used as the additional acidic solution.

PREFERRED EMBODIMENTS

Figure 2A:
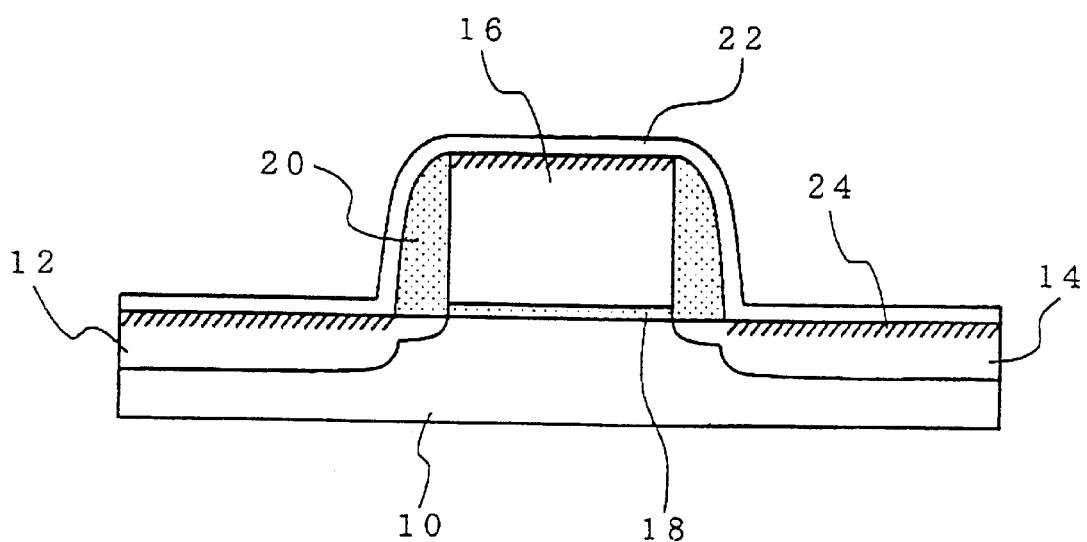
FIG. 2A is a fragmentary cross sectional elevation view illustrative of a MOS field effect transistor after an ion-implantation process and subsequent rapid thermal anneal for activation to source and drain regions have been carried out in accordance with a novel method in all embodiments of the present invention.
Figure 2B:
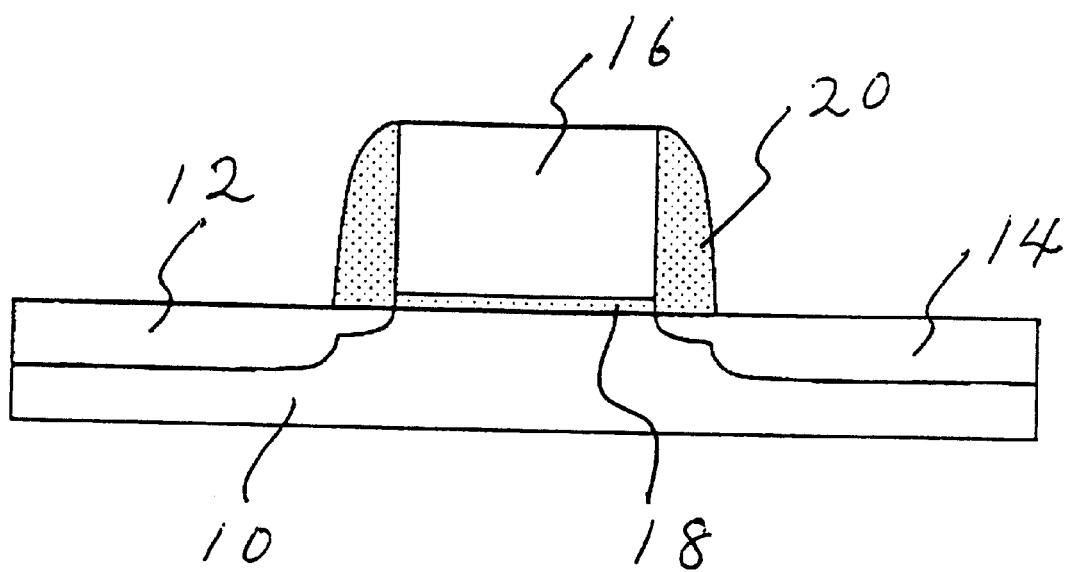
FIG. 2B is a fragmentary cross sectional elevation view illustrative of a MOS field effect transistor after a TEOS oxide film has been removed by a wet etching process using a diluted hydrofluoric acid solution in accordance with a novel method in the all embodiments of the present invention.

A first embodiment according to the present invention will be described in detail with reference to the drawings. FIG. 2A is a fragmentary cross sectional elevation view illustrative of a MOS field effect transistor after an ion-implantation process and subsequent rapid thermal anneal for activation to source and drain regions have been carried out in accordance with a novel method in all embodiments of the present invention. FIG. 2B is a fragmentary cross sectional elevation view illustrative of a MOS field effect transistor after a TEOS oxide film has been removed by a wet etching process using a diluted hydrofluoric acid solution in accordance with a novel method in the embodiments of the present invention.

With reference to FIG. 2A, a gate oxide film 18 made of silicon dioxide is formed on a surface of a silicon substrate 10. A gate electrode 16 made of an impurity-doped polysilicon is formed on the gate oxide film 18. The gate electrode 16 has a height of 1500 angstroms and a gate length of 2.0 micrometers. A TEOS oxide film is entirely deposited by a low pressure chemical vapor deposition method and then the TEOS oxide film is subjected to an isotropic etching thereby forming TEOS side wall oxide films 20 on side walls of the gate electrode 16. The TEOS side wall oxide films 20 have a width of 800 angstroms. Subsequently, an additional TEOS oxide film is also deposited entirely by a low pressure chemical vapor deposition method to form a TEOS through oxide layer 22 having a thickness of 100 angstroms. The TEOS through oxide layer 22 extends on a top surface of the gate electrode 16 and on the TEOS side wall oxide films 20 as well as on the top surface of the silicon substrate 10. An ion-implantation process is carried out by using the gate electrode 16 and the TEOS side wall oxide films 20 as a mask to implant ions through the TEOS through oxide layer 22 into the silicon substrate 10. A rapid thermal annealing is carried out in a nitrogen atmosphere at a temperature of 1020° C. for 10 seconds, where a temperature rising rate is 100° C./sec for activation of the implanted ions into the silicon substrate, whereby source and drain regions 12 and 14 are formed in the silicon substrate 10. A knock-on phenomenon of carbon and oxygen and the rapid thermal annealing for activation to the implanted ions causes a Si—O—C based silicide reaction inhibitor layer 24 to be formed on an interface between the top surface of the gate electrode and the TEOS through oxide layer 22 and also on interfaces between the source and drain regions 12 and 14 and the TEOS through oxide layer 22.

The above processes are the same as the conventional method. However, the following processes for removal of the TEOS through oxide layer 22 and the Si—O—C based silicide reaction inhibitor layer 24 and subsequent treatment prior to formation of a cobalt silicide layer are novel and different from the conventional method.

Figure 3:
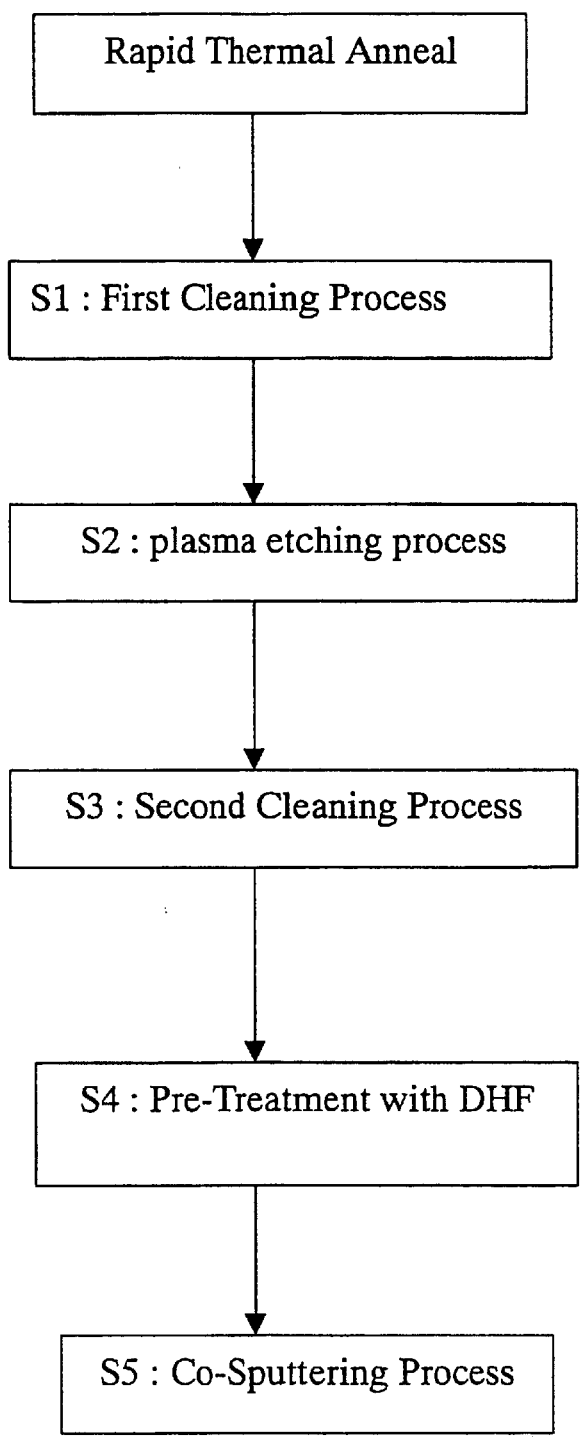
FIG. 3 is a flow chart explaining a novel process for removal of the TEOS through oxide layer and the Si—O—C based silicide reaction inhibitor layer and subsequent treatment prior to formation of a cobalt silicide layer in a first embodiment in accordance with the present invention.

FIG. 3 is a flow chart explaining a novel process for removal of the TEOS through oxide layer 22 and the Si—O—C based silicide reaction inhibitor layer 24 and subsequent treatment prior to formation of a cobalt silicide layer in this first embodiment in accordance with the present invention.

After the rapid thermal annealing has been carried out for activation of the implanted ions to form the source and drain regions, then as a first step S1, a first cleaning process is carried out to clean a surface of the TEOS through oxide layer 22 by use of any one of a sulfate-hydrogen peroxide solution and an ammonium-hydrogen peroxide solution.

In a second step S2, a dry etching process is carried out by use of a plasma with $CF_4+O_2$ mixture gases at a pressure of 1500 mTorr and a power of 100 W for five different time periods in the range of 30–120 seconds, wherein $O_2$ gas is used to control an etching rate and also to suppress deposition. For example, the above five different time periods of the dry etching are 30 seconds, 75 seconds, 90 seconds 105 seconds and 120 seconds. The dry etching process causes the TEOS through oxide layer 22 and the Si—O—C based silicide reaction inhibitor layer 24 to be removed from the top surfaces of the gate electrode 16 and the source and drain regions 12 and 14.

In a third step S3, a second cleaning process is carried out by use of any one of a sulfate-hydrogen peroxide solution and an ammonium-hydrogen peroxide solution, in order to clean the top surfaces of the gate electrode 16 and the source and drain regions 12 and 14.

In a fourth step S4, a previous treatment is carried out to further cleaning the top surfaces of the gate electrode 16 and the source and drain regions 12 and 14 by subjecting the top surfaces of the gate electrode 16 and the source and drain regions 12 and 14 to a diluted hydrofluoric acid solution of a dilution ratio of 1:100 for a time period of 60 seconds, whereby the structure shown in FIG. 2B is obtained.

In a fifth step S5, a cobalt-sputtering process is carried out by sputtering a cobalt target to entirely deposit a cobalt layer having a thickness of 100 angstroms onto a cleaned surface of the gate electrode 16, and on the TEOS side wall oxide films as well as on cleaned surfaces of the source and drain regions 12 and 14. This deposition process is carried out at a sputtering temperature in the range of 350–400° C. so as to cause a cobalt silicidation reaction thereby to form a cobalt silicide ($CoSi_2$) layer having a thickness of 300 angstroms on the cleaned top surfaces of the gate electrode 16 and the source and drain regions 12 and 14.

A cumulative probability distribution in sheet resistance of the cobalt silicide layer is found. FIG. 4 is a diagram illustrative of the found cumulative probability distribution in sheet resistance of the cobalt silicide layer as formed in the novel process shown in FIG. 3, wherein a gate size is set to be 2.0 micrometers. ○ represents that the cobalt silicide layer is carried out under the conditions that the first cleaning process is carried out and the plasma etching is carried out for 30 seconds. ◇ represents that the cobalt silicide layer is carried out under the conditions that the first cleaning process is carried out and the plasma etching is carried out for 75 seconds. △ represents that the cobalt silicide layer is carried out under the conditions that the first cleaning process is carried out and the plasma etching is carried out for 90 seconds. ▽ represents that the cobalt silicide layer is carried out under the conditions that the first cleaning process is carried out and the plasma etching is carried out for 105 seconds. X represents that the cobalt silicide layer is carried out under the conditions that the first cleaning process is carried out and the plasma etching is carried out for 120 seconds. FIG. 4 shows that the plasma etching using the $CF_4+O_2$ mixture gases for at least 30 seconds or in a time period of not less than 30 seconds causes that the cobalt silicide layer has a sufficiently reduced sheet resistance and a sufficiently reduced variation in sheet resistance. The variation in sheet resistance of the cobalt silicide layer is represented by a gradient of plots of individual types. A degree of variation of in sheet resistance of the cobalt silicide layer for individual conditions is not so different from each other. The results shown in FIG. 4 means that the dry etching process mentioned above causes a sufficient removal of the silicidation reaction inhibitor layer from the surfaces of the gate electrode and the source and drain regions, thereby ensuring that a cobalt silicide layer having superior and desirable properties is formed on the surfaces of the gate electrode and the source and drain regions.

A second embodiment according to the present invention will be described in detail with reference to the drawings.

With reference again to FIG. 2A, a gate oxide film 18 made of silicon dioxide is formed on a surface of a silicon substrate 10. A gate electrode 16 made of an impurity-doped polysilicon is formed on the gate oxide film 18. The gate electrode 16 has a height of 1500 angstroms and a gate length of 2.0 micrometers. A TEOS oxide film is entirely deposited by a low pressure chemical vapor deposition method and then the TEOS oxide film is subjected to an isotropic etching thereby forming TEOS side wall oxide films 20 on side walls of the gate electrode 16. The TEOS side wall oxide films 20 have a width of 800 angstroms. Subsequently, an additional TEOS oxide film is also deposited entirely by a low pressure chemical vapor deposition method to form a TEOS through oxide layer 22 having a thickness of 100 angstroms. The TEOS through oxide layer 22 extends on a top surface of the gate electrode 16 and on the TEOS side wall oxide films 20 as well as on the top surface of the silicon substrate 10. An ion-implantation process is carried out by using the gate electrode 16 and the TEOS side wall oxide films 20 as a mask to implant ions through the TEOS through oxide layer 22 into the silicon substrate 10. A rapid thermal annealing is carried out in a nitrogen atmosphere at a temperature of 1020° C. for 10 seconds, where a temperature rising rate is 100° C./sec for activation of the implanted ions into the silicon substrate, whereby source and drain regions 12 and 14 are formed in the silicon substrate 10. A knock-on phenomenon of carbon and oxygen and the rapid thermal annealing for activation to the implanted ions causes a Si—O—C based silicide reaction inhibitor layer 24 to be formed on an interface between the top surface of the gate electrode and the TEOS through oxide layer 22 and also on interfaces between the source and drain regions 12 and 14 and the TEOS through oxide layer 22.

The above processes are the same as the first embodiment and the conventional method. However, the following processes for removal of the TEOS through oxide layer 22 and the Si—O—C based silicide reaction inhibitor layer 24 and subsequent treatment prior to formation of a cobalt silicide layer are novel and different from the conventional method.

Figure 5:
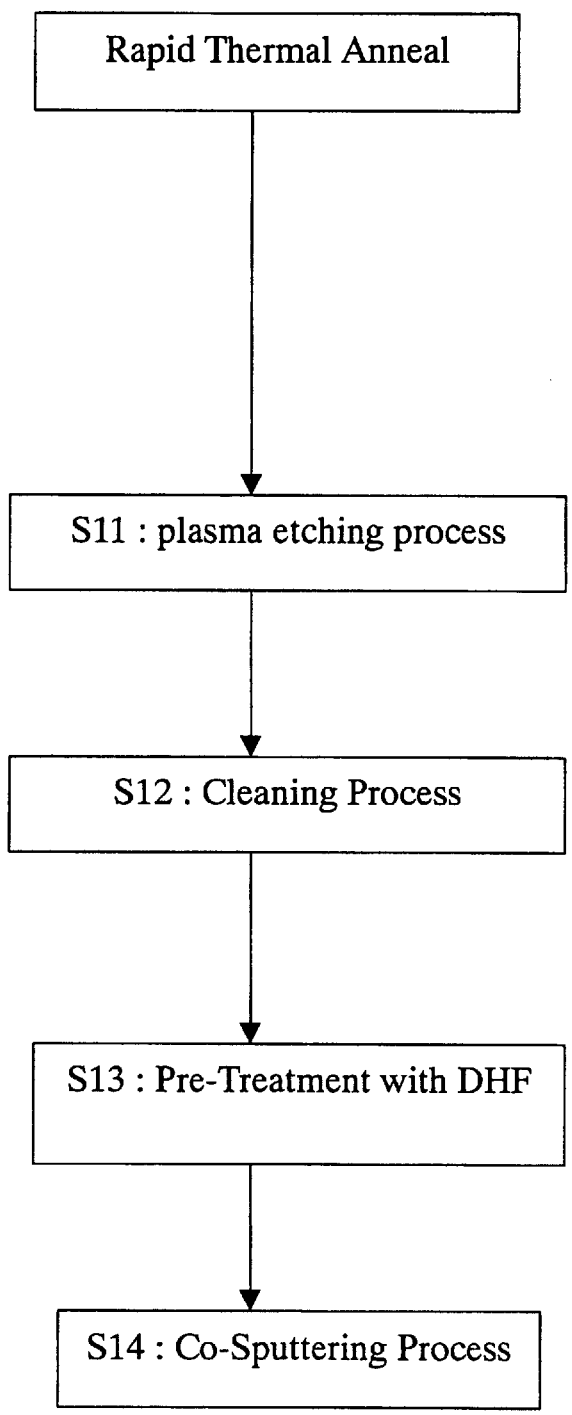
FIG. 5 is a flow chart explaining a novel process for removal of the TEOS through oxide layer and the Si—O—C based silicide reaction inhibitor layer and subsequent treatment prior to formation of a cobalt silicide layer in this second embodiment in accordance with the present invention.

FIG. 5 is a flow chart explaining a novel process for removal of the TEOS through oxide layer 22 and the Si—O—C based silicide reaction inhibitor layer 24 and subsequent treatment prior to formation of a cobalt silicide layer in this second embodiment in accordance with the present invention.

After the rapid thermal annealing has been carried out for activation of the implanted ions to form the source and drain regions, then as a first step S11, a dry etching process is carried out by use of a plasma with $CF_4+O_2$ mixture gases at a pressure of 1500 mTorr and a power of 100 W for five different time periods in the range of 30–120 seconds, wherein $O_2$ gas is used to control an etching rate and also to suppress deposition. For example, the above five different time periods of the dry etching are 30 seconds, 75 seconds, 90 seconds 105 seconds and 120 seconds. The dry etching process causes the TEOS through oxide layer 22 and the Si—O—C based silicide reaction inhibitor layer 24 to be removed from the top surfaces of the gate electrode 16 and the source and drain regions 12 and 14.

In a second step S12, a cleaning process is carried out by use of any one of a sulfate-hydrogen peroxide solution and an ammonium-hydrogen peroxide solution, in order to clean the top surfaces of the gate electrode 16 and the source and drain regions 12 and 14.

In a third step S13, a previous treatment is carried out to further cleaning the top surfaces of the gate electrode 16 and the source and drain regions 12 and 14 by subjecting the top surfaces of the gate electrode 16 and the source and drain regions 12 and 14 to a diluted hydrofluoric acid solution of a dilution ratio of 1:100 for a time period of 60 seconds, whereby the structure shown in FIG. 2B is obtained.

In a fourth step S14, a cobalt-sputtering process is carried out by sputtering a cobalt target to entirely deposit a cobalt layer having a thickness of 100 angstroms onto a cleaned surface of the gate electrode 16, and on the TEOS side wall oxide films as well as on cleaned surfaces of the source and drain regions 12 and 14. This deposition process is carried out at a sputtering temperature in the range of 350–400° C. so as to cause a cobalt silicidation reaction thereby to form a cobalt silicide ($CoSi_2$) layer having a thickness of 300 angstroms on the cleaned top surfaces of the gate electrode 16 and the source and drain regions 12 and 14.

A cumulative probability distribution in sheet resistance of the cobalt silicide layer is found. FIG. 6 is a diagram illustrative of the found cumulative probability distribution in sheet resistance of the cobalt silicide layer as formed in the novel process shown in FIG. 5, wherein a gate size is set to be 2.0 micrometers. ○ represents that the cobalt silicide layer is carried out under the conditions that no cleaning process prior to the plasma etching process is carried out, and the plasma etching is carried out for 30 seconds. ◇ represents that the cobalt silicide layer is carried out under the conditions that no cleaning process prior to the plasma etching process is carried out, and the plasma etching is carried out for 75 seconds. △ represents that the cobalt silicide layer is carried out under the conditions that no cleaning process prior to the plasma etching process is carried out, and the plasma etching is carried out for 90 seconds. ▽ represents that the cobalt silicide layer is carried out under the conditions that no cleaning process prior to the plasma etching process is carried out, and the plasma etching is carried out for 105 seconds. X represents that the cobalt silicide layer is carried out under the conditions that no cleaning process prior to the plasma etching process is carried out, and the plasma etching is carried out for 120 seconds. FIG. 6 shows that the plasma etching using the $CF_4+O_2$ mixture gases for 30 seconds causes that the cobalt silicide layer has a sufficiently reduced sheet resistance but a relatively large variation in sheet resistance. The variation in sheet resistance of the cobalt silicide layer is represented by a gradient of plots of individual types. However, the plasma etching using the $CF_4+O_2$ mixture gases for a longer time period than 30 seconds, for example, at least 75 seconds causes that the cobalt silicide layer has not only a sufficiently reduced sheet resistance but also a sufficiently reduced variation in sheet resistance. A degree of variation of in sheet resistance of the cobalt silicide layer for individual conditions is not so different from each other under the conditions that the time period of the plasma etching process is longer than 30 seconds. The results shown in FIG. 6 means that even no cleaning process is carried out prior to the plasma etching process, the dry etching process mentioned above causes a sufficient removal of the silicidation reaction inhibitor layer from the surfaces of the gate electrode and the source and drain regions, thereby ensuring that a cobalt silicide layer having superior and desirable properties is formed on the surfaces of the gate electrode and the source and drain regions.

A third embodiment according to the present invention will be described in detail with reference to the drawings.

With reference to FIG. 2A, a gate oxide film 18 made of silicon dioxide is formed on a surface of a silicon substrate 10. A gate electrode 16 made of an impurity-doped polysilicon is formed on the gate oxide film 18. The gate electrode 16 has a height of 1500 angstroms and a gate length of 2.0 micrometers. A TEOS oxide film is entirely deposited by a low pressure chemical vapor deposition method and then the TEOS oxide film is subjected to an isotropic etching thereby forming TEOS side wall oxide films 20 on side walls of the gate electrode 16. The TEOS side wall oxide films 20 have a width of 800 angstroms. Subsequently, an additional TEOS oxide film is also deposited entirely by a low pressure chemical vapor deposition method to form a TEOS through oxide layer 22 having a thickness of 100 angstroms. The TEOS through oxide layer 22 extends on a top surface of the gate electrode 16 and on the TEOS side wall oxide films 20 as well as on the top surface of the silicon substrate 10. An ion-implantation process is carried out by using the gate electrode 16 and the TEOS side wall oxide films 20 as a mask to implant ions through the TEOS through oxide layer 22 into the silicon substrate 10. A rapid thermal annealing is carried out in a nitrogen atmosphere at a temperature of 1020° C. for 10 seconds, where a temperature rising rate is 100° C./sec for activation of the implanted ions into the silicon substrate, whereby source and drain regions 12 and 14 are formed in the silicon substrate 10. A knock-on phenomenon of carbon and oxygen and the rapid thermal annealing for activation to the implanted ions causes a Si—O—C based silicide reaction inhibitor layer 24 to be formed on an interface between the top surface of the gate electrode and the TEOS through oxide layer 22 and also on interfaces between the source and drain regions 12 and 14 and the TEOS through oxide layer 22.

The above processes are the same as the first and second embodiments and the conventional method. However, the following processes for removal of the TEOS through oxide layer 22 and the Si—O—C based silicide reaction inhibitor layer 24 and subsequent treatment prior to formation of a cobalt silicide layer are novel and different from the conventional method.

Figure 7:
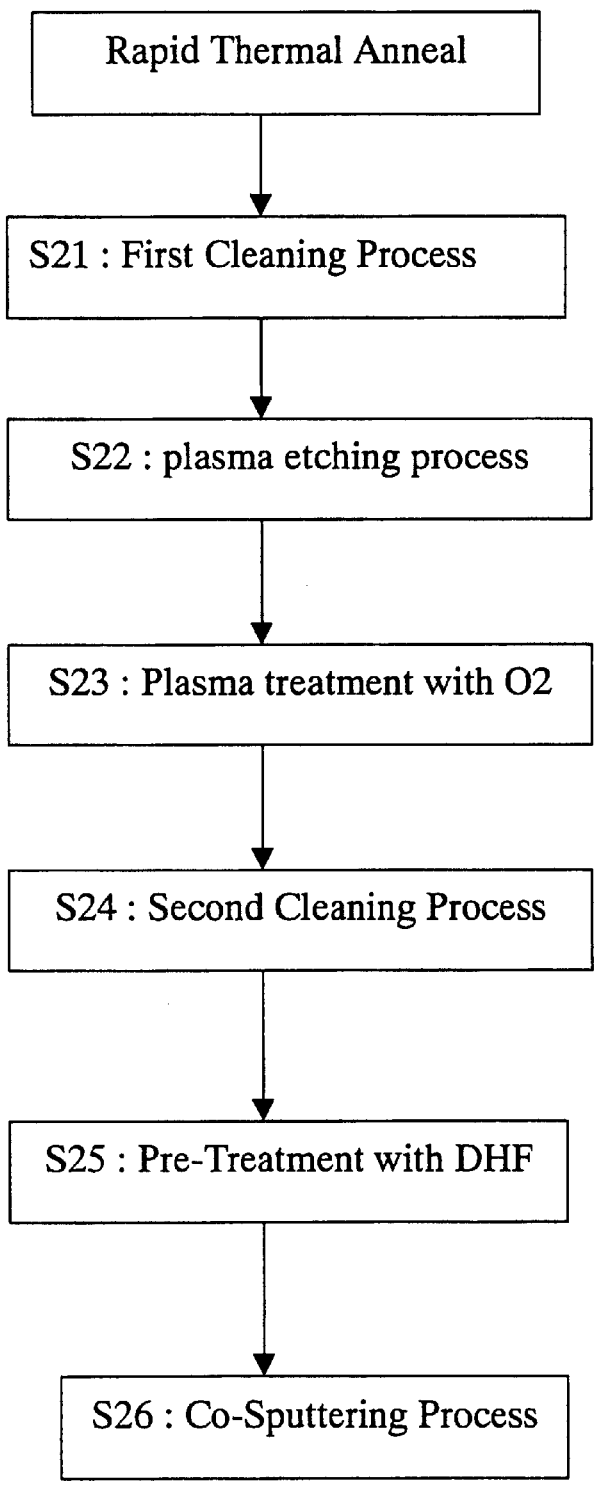
FIG. 7 is a flow chart explaining a novel process for removal of the TEOS through oxide layer and the Si—O—C based silicide reaction inhibitor layer and subsequent treatment prior to formation of a cobalt silicide layer in this third embodiment in accordance with the present invention.

FIG. 7 is a flow chart explaining a novel process for removal of the TEOS through oxide layer 22 and the Si—O—C based silicide reaction inhibitor layer 24 and subsequent treatment prior to formation of a cobalt silicide layer in this third embodiment in accordance with the present invention.

After the rapid thermal annealing has been carried out for activation of the implanted ions to form the source and drain regions, then as a first step S21, a first cleaning process is carried out to clean a surface of the TEOS through oxide layer 22 by use of any one of a sulfate-hydrogen peroxide solution and an ammonium-hydrogen peroxide solution.

In a second step S22, a dry etching process is carried out by use of a plasma with $CF_4+O_2$ mixture gases at a pressure of 1500 mTorr and a power of 100 W for five different time periods in the range of 30–120 seconds, wherein $O_2$ gas is used to control an etching rate and also to suppress deposition. For example, the above five different time periods of the dry etching are 30 seconds, 75 seconds, 90 seconds 105 seconds and 120 seconds. The dry etching process causes the TEOS through oxide layer 22 and the Si—O—C based silicide reaction inhibitor layer 24 to be removed from the top surfaces of the gate electrode 16 and the source and drain regions 12 and 14.

In a third step S23, the top surfaces of the gate electrode 16 and the source and drain regions 12 and 14 are subjected to a plasma treatment by use of the plasma etching system having used for the plasma etching process in the second step S23. The plasma treatment is carried out using $O_2$ plasma at a pressure of 1000 mTorr and a power of 1400 W for a time period of 20 seconds in order to remove contaminants such as polymer from the surfaces of the gate electrode 16 and the source and drain regions 12 and 14, wherein the contaminants such as polymer have been adhered by the previous dry etching process on the surfaces of the gate electrode 16 and the source and drain regions 12 and 14.

In a fourth step S24, a second cleaning process is carried out by use of any one of a sulfate-hydrogen peroxide solution and an ammonium-hydrogen peroxide solution, in order to clean the top surfaces of the gate electrode 16 and the source and drain regions 12 and 14.

In a fifth step S25, a previous treatment is carried out to further cleaning the top surfaces of the gate electrode 16 and the source and drain regions 12 and 14 by subjecting the top surfaces of the gate electrode 16 and the source and drain regions 12 and 14 to a diluted hydrofluoric acid solution of a dilution ratio of 1:100 for a time period of 60 seconds, whereby the structure shown in FIG. 2B is obtained.

In a sixth step S26, a cobalt-sputtering process is carried out by sputtering a cobalt target to entirely deposit a cobalt layer having a thickness of 100 angstroms onto a cleaned surface of the gate electrode 16, and on the TEOS side wall oxide films as well as on cleaned surfaces of the source and drain regions 12 and 14. This deposition process is carried out at a sputtering temperature in the range of 350–400° C. so as to cause a cobalt silicidation reaction thereby to form a cobalt silicide ($CoSi_2$) layer having a thickness of 300 angstroms on the cleaned top surfaces of the gate electrode 16 and the source and drain regions 12 and 14.

A difference in process of the novel method of this third embodiment from the first embodiment is only to further carry out the $O_2$ plasma treatment after the plasma etching process has been carried out in the second step S22 and before the second cleaning process 24 in the fourth step, so that the contaminants such as polymer are removed from the top surfaces of the gate electrode 16 and the source and drain regions 12 and 14. A degree of clean of the top surfaces of the gate electrode 16 and the source and drain regions 12 and 14 is of course higher than the first embodiment, for which reason the effects of this third embodiment are superior than the first embodiment. Namely, the plasma etching using the $CF_4+O_2$ mixture gases for at least 30 seconds or in a time period of not less than 30 seconds causes that the cobalt silicide layer has a sufficiently reduced sheet resistance and a sufficiently reduced variation in sheet resistance. A degree of variation of in sheet resistance of the cobalt silicide layer for individual conditions is not so different from each other. The dry etching process mentioned above causes a sufficient removal of the silicidation reaction inhibitor layer from the surfaces of the gate electrode and the source and drain regions, thereby ensuring that a cobalt silicide layer having superior and desirable properties is formed on the surfaces of the gate electrode and the source and drain regions.

A fourth embodiment according to the present invention will be described in detail with reference to the drawings.

With reference to FIG. 2A, a gate oxide film 18 made of silicon dioxide is formed on a surface of a silicon substrate 10. A gate electrode 16 made of an impurity-doped polysilicon is formed on the gate oxide film 18. The gate electrode 16 has a height of 1500 angstroms and a gate length of 2.0 micrometers. A TEOS oxide film is entirely deposited by a low pressure chemical vapor deposition method and then the TEOS oxide film is subjected to an isotropic etching thereby forming TEOS side wall oxide films 20 on side walls of the gate electrode 16. The TEOS side wall oxide films 20 have a width of 800 angstroms. Subsequently, an additional TEOS oxide film is also deposited entirely by a low pressure chemical vapor deposition method to form a TEOS through oxide layer 22 having a thickness of 100 angstroms. The TEOS through oxide layer 22 extends on a top surface of the gate electrode 16 and on the TEOS side wall oxide films 20 as well as on the top surface of the silicon substrate 10. An ion-implantation process is carried out by using the gate electrode 16 and the TEOS side wall oxide films 20 as a mask to implant ions through the TEOS through oxide layer 22 into the silicon substrate 10. A rapid thermal annealing is carried out in a nitrogen atmosphere at a temperature of 1020° C. for 10 seconds, where a temperature rising rate is 100° C./sec for activation of the implanted ions into the silicon substrate, whereby source and drain regions 12 and 14 are formed in the silicon substrate 10. A knock-on phenomenon of carbon and oxygen and the rapid thermal annealing for activation to the implanted ions causes a Si—O—C based silicide reaction inhibitor layer 24 to be formed on an interface between the top surface of the gate electrode and the TEOS through oxide layer 22 and also on interfaces between the source and drain regions 12 and 14 and the TEOS through oxide layer 22.

The above processes are the same as the first, second and third embodiments as well as the conventional method. However, the following processes for removal of the TEOS through oxide layer 22 and the Si—O—C based silicide reaction inhibitor layer 24 and subsequent treatment prior to formation of a cobalt silicide layer are novel and different from the conventional method.

Figure 8:
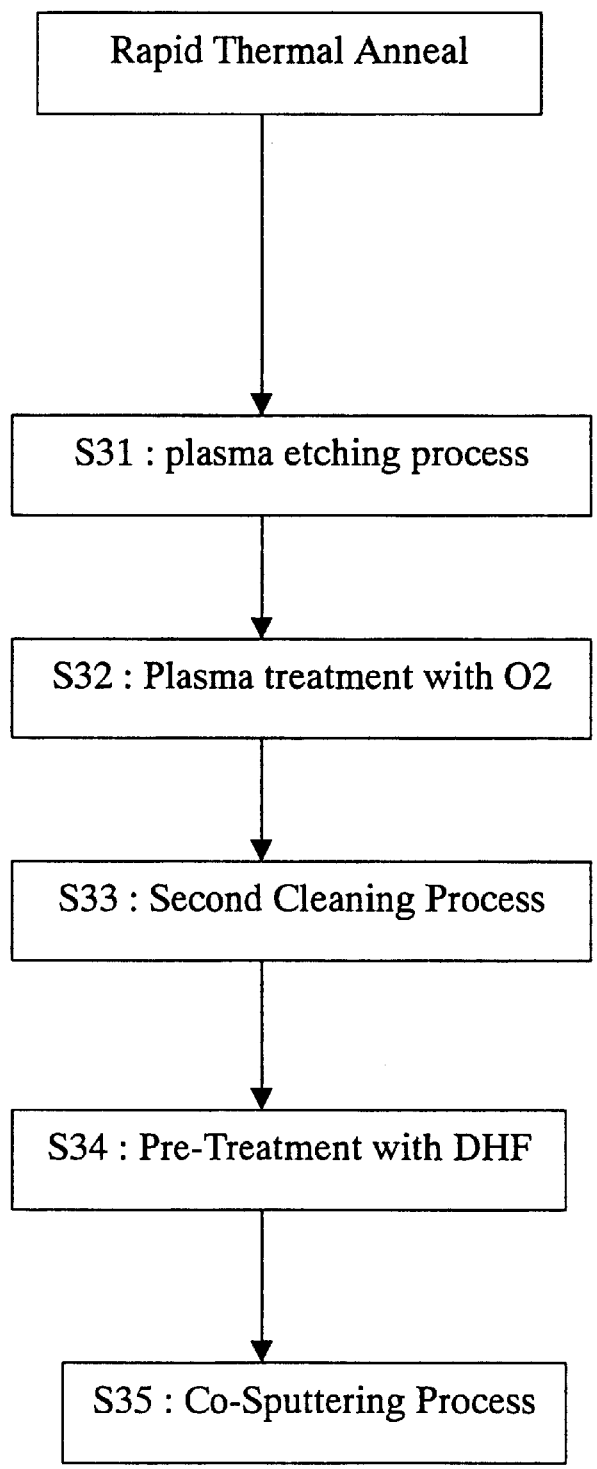
FIG. 8 is a flow chart explaining a novel process for removal of the TEOS through oxide layer and the Si—O—C based silicide reaction inhibitor layer and subsequent treatment prior to formation of a cobalt silicide layer in a fourth embodiment in accordance with the present invention.

FIG. 8 is a flow chart explaining a novel process for removal of the TEOS through oxide layer 22 and the Si—O—C based silicide reaction inhibitor layer 24 and subsequent treatment prior to formation of a cobalt silicide layer in this fourth embodiment in accordance with the present invention.

After the rapid thermal annealing has been carried out for activation of the implanted ions to form the source and drain regions, then as a first step S31, a dry etching process is carried out by use of a plasma with $CF_4+O_2$ mixture gases at a pressure of 1500 mTorr and a power of 100 W for five different time periods in the range of 30–120 seconds, wherein $O_2$ gas is used to control an etching rate and also to suppress deposition. For example, the above five different time periods of the dry etching are 30 seconds, 75 seconds, 90 seconds 105 seconds and 120 seconds. The dry etching process causes the TEOS through oxide layer 22 and the Si—O—C based silicide reaction inhibitor layer 24 to be removed from the top surfaces of the gate electrode 16 and the source and drain regions 12 and 14.

In a second step S32, the top surfaces of the gate electrode 16 and the source and drain regions 12 and 14 are subjected to a plasma treatment by use of the plasma etching system having used for the plasma etching process in the first step S31. The plasma treatment is carried out using $O_2$ plasma at a pressure of 1000 mTorr and a power of 1400 W for a time period of 20 seconds in order to remove contaminants such as polymer from the surfaces of the gate electrode 16 and the source and drain regions 12 and 14, wherein the contaminants such as polymer have been adhered by the previous dry etching process on the surfaces of the gate electrode 16 and the source and drain regions 12 and 14.

In a third step S33, a cleaning process is carried out by use of any one of a sulfate-hydrogen peroxide solution and an ammonium-hydrogen peroxide solution, in order to clean the top surfaces of the gate electrode 16 and the source and drain regions 12 and 14.

In a fourth step S34, a previous treatment is carried out to further cleaning the top surfaces of the gate electrode 16 and the source and drain regions 12 and 14 by subjecting the top surfaces of the gate electrode 16 and the source and drain regions 12 and 14 to a diluted hydrofluoric acid solution of a dilution ratio of 1:100 for a time period of 60 seconds, whereby the structure shown in FIG. 2B is obtained.

In a fifth step S35, a cobalt-sputtering process is carried out by sputtering a cobalt target to entirely deposit a cobalt layer having a thickness of 100 angstroms onto a cleaned surface of the gate electrode 16, and on the TEOS side wall oxide films as well as on cleaned surfaces of the source and drain regions 12 and 14. This deposition process is carried out at a sputtering temperature in the range of 350–400° C. so as to cause a cobalt silicidation reaction thereby to form a cobalt silicide ($CoSi_2$) layer having a thickness of 300 angstroms on the cleaned top surfaces of the gate electrode 16 and the source and drain regions 12 and 14.

A difference in process of the novel method of this fourth embodiment from the second embodiment is only to further carry out the $O_2$ plasma treatment after the plasma etching process has been carried out in the first step S31 and before the cleaning process in the third step 34, so that the contaminants such as polymer are removed from the top surfaces of the gate electrode 16 and the source and drain regions 12 and 14. A degree of clean of the top surfaces of the gate electrode 16 and the source and drain regions 12 and 14 is of course higher than the second embodiment, for which reason the effects of this fourth embodiment are superior than the second embodiment. Namely, the plasma etching using the $CF_4+O_2$ mixture gases for 30 seconds causes that the cobalt silicide layer has a sufficiently reduced sheet resistance but a relatively large variation in sheet resistance. However, the plasma etching using the $CF_4+O_2$ mixture gases for a longer time period than 30 seconds, for example, at least 75 seconds causes that the cobalt silicide layer has not only a sufficiently reduced sheet resistance but also a sufficiently reduced variation in sheet resistance. A degree of variation of in sheet resistance of the cobalt silicide layer for individual conditions is not so different from each other under the conditions that the time period of the plasma etching process is longer than 30 seconds. Even no cleaning process is carried out prior to the plasma etching process, the dry etching process mentioned above causes a sufficient removal of the silicidation reaction inhibitor layer from the surfaces of the gate electrode and the source and drain regions, thereby ensuring that a cobalt silicide layer having superior and desirable properties is formed on the surfaces of the gate electrode and the source and drain regions.

A fifth embodiment according to the present invention will be described in detail with reference to the drawings.

With reference to FIG. 2A, a gate oxide film 18 made of silicon dioxide is formed on a surface of a silicon substrate 10. A gate electrode 16 made of an impurity-doped polysilicon is formed on the gate oxide film 18. The gate electrode 16 has a height of 1500 angstroms and a gate length of 2.0 micrometers. A TEOS oxide film is entirely deposited by a low pressure chemical vapor deposition method and then the TEOS oxide film is subjected to an isotropic etching thereby forming TEOS side wall oxide films 20 on side walls of the gate electrode 16. The TEOS side wall oxide films 20 have a width of 800 angstroms. Subsequently, an additional TEOS oxide film is also deposited entirely by a low pressure chemical vapor deposition method to form a TEOS through oxide layer 22 having a thickness of 100 angstroms. The TEOS through oxide layer 22 extends on a top surface of the gate electrode 16 and on the TEOS side wall oxide films 20 as well as on the top surface of the silicon substrate 10. An ion-implantation process is carried out by using the gate electrode 16 and the TEOS side wall oxide films 20 as a mask to implant ions through the TEOS through oxide layer 22 into the silicon substrate 10. A rapid thermal annealing is carried out in a nitrogen atmosphere at a temperature of 1020° C. for 10 seconds, where a temperature rising rate is 100° C./sec for activation of the implanted ions into the silicon substrate, whereby source and drain regions 12 and 14 are formed in the silicon substrate 10. A knock-on phenomenon of carbon and oxygen and the rapid thermal annealing for activation to the implanted ions causes a Si—O—C based silicide reaction inhibitor layer 24 to be formed on an interface between the top surface of the gate electrode and the TEOS through oxide layer 22 and also on interfaces between the source and drain regions 12 and 14 and the TEOS through oxide layer 22.

The above processes are the same as the conventional method. However, the following processes for removal of the TEOS through oxide layer 22 and the Si—O—C based silicide reaction inhibitor layer 24 and subsequent treatment prior to formation of a cobalt silicide layer are novel and different from the conventional method.

Figure 9:
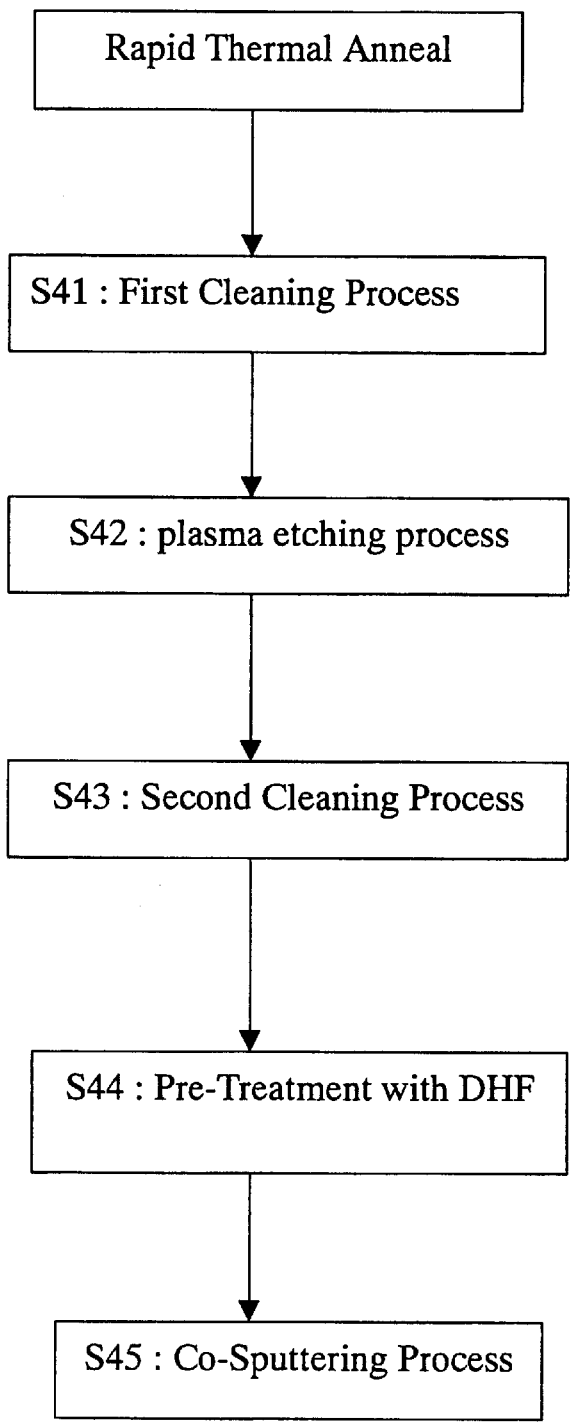
FIG. 9 is a flow chart explaining a novel process for removal of the TEOS through oxide layer and the Si—O—C based silicide reaction inhibitor layer and subsequent treatment prior to formation of a cobalt silicide layer in a fifth embodiment in accordance with the present invention.

FIG. 9 is a flow chart explaining a novel process for removal of the TEOS through oxide layer 22 and the Si—O—C based silicide reaction inhibitor layer 24 and subsequent treatment prior to formation of a cobalt silicide layer in this fifth embodiment in accordance with the present invention. A difference in process of this fifth embodiment from the first embodiment is only that the first cleaning process is so carried out by a wet etching not only to clean the top surface of the TEOS through oxide layer 22 but also to etch a surface portion of the TEOS through oxide layer 22, so as to shorten the time for carrying out the subsequent plasma etching process. The plasma etching is capable of etching not only the TEOS through oxide layer 22 and the silicidation reaction inhibitor layer 24 but also surface portions of the gate electrode 16 and the source and drain regions 12 and 14. Particularly when the source and drain regions 12 and 14 have extremely shallow p-n junctions for scaling down the semiconductor device, a long time plasma etching makes it difficult to surely prevent any substantive over-etching to the surface portions of the source and drain regions. In order to prevent such a long time plasma etching, the first cleaning process is so carried out to wet-etch surface portions of the TEOS through oxide layer 22.

After the rapid thermal annealing has been carried out for activation of the implanted ions to form the source and drain regions, then as a first step S41, a first cleaning process is carried out by use of any one of a sulfate-hydrogen peroxide solution and an ammonium-hydrogen peroxide solution so as not only to clean a surface of the TEOS through oxide layer 22 but also to wet-etch a surface portion of the TEOS through oxide layer 22.

In a second step S42, a dry etching process is carried out by use of a plasma with $CF_4+O_2$ mixture gases at a pressure of 1500 mTorr and a power of 100 W for five different time periods in the range of 30–120 seconds, wherein $O_2$ gas is used to control an etching rate and also to suppress deposition. The dry etching process causes the remaining portion of the TEOS through oxide layer 22 and the Si—O—C based silicide reaction inhibitor layer 24 to be removed from the top surfaces of the gate electrode 16 and the source and drain regions 12 and 14. Since the surface portion of the TEOS through oxide layer 22 has already removed in the previous cleaning process, the necessary time for removing the remaining part of the TEOS through oxide layer 22 is shortened. The plasma etching is capable of etching not only the TEOS through oxide layer 22 and the silicidation reaction inhibitor layer 24 but also surface portions of the gate electrode 16 and the source and drain regions 12 and 14. Even if the source and drain regions 12 and 14 have extremely shallow p-n junctions for scaling down the semiconductor device, a shortened time plasma etching makes it possible to surely prevent any substantive over-etching to the surface portions of the source and drain regions.

In a third step S43, a second cleaning process is carried out by use of any one of a sulfate-hydrogen peroxide solution and an ammonium-hydrogen peroxide solution, in order to clean the top surfaces of the gate electrode 16 and the source and drain regions 12 and 14.

In a fourth step S44, a previous treatment is carried out to further cleaning the top surfaces of the gate electrode 16 and the source and drain regions 12 and 14 by subjecting the top surfaces of the gate electrode 16 and the source and drain regions 12 and 14 to a diluted hydrofluoric acid solution of a dilution ratio of 1:100 for a time period of 60 seconds, whereby the structure shown in FIG. 2B is obtained.

In a fifth step S45, a cobalt-sputtering process is carried out by sputtering a cobalt target to entirely deposit a cobalt layer having a thickness of 100 angstroms onto a cleaned surface of the gate electrode 16, and on the TEOS side wall oxide films as well as on cleaned surfaces of the source and drain regions 12 and 14. This deposition process is carried out at a sputtering temperature in the range of 350–400° C. so as to cause a cobalt silicidation reaction thereby to form a cobalt silicide ($CoSi_2$) layer having a thickness of 300 angstroms on the cleaned top surfaces of the gate electrode 16 and the source and drain regions 12 and 14.

The plasma etching using the $CF_4+O_2$ mixture gases for at least 30 seconds or in a time period of not less than 30 seconds causes that the cobalt silicide layer has a sufficiently reduced sheet resistance and a sufficiently reduced variation in sheet resistance. A degree of variation of in sheet resistance of the cobalt silicide layer for individual conditions is not so different from each other. The dry etching process mentioned above causes a sufficient removal of the silicidation reaction inhibitor layer from the surfaces of the gate electrode and the source and drain regions, thereby ensuring that a cobalt silicide layer having superior and desirable properties is formed on the surfaces of the gate electrode and the source and drain regions.

A sixth embodiment according to the present invention will be described in detail with reference to the drawings.

With reference to FIG. 2A, a gate oxide film 18 made of silicon dioxide is formed on a surface of a silicon substrate 10. A gate electrode 16 made of an impurity-doped polysilicon is formed on the gate oxide film 18. The gate electrode 16 has a height of 1500 angstroms and a gate length of 2.0 micrometers. A TEOS oxide film is entirely deposited by a low pressure chemical vapor deposition method and then the TEOS oxide film is subjected to an isotropic etching thereby forming TEOS side wall oxide films 20 on side walls of the gate electrode 16. The TEOS side wall oxide films 20 have a width of 800 angstroms. Subsequently, an additional TEOS oxide film is also deposited entirely by a low pressure chemical vapor deposition method to form a TEOS through oxide layer 22 having a thickness of 100 angstroms. The TEOS through oxide layer 22 extends on a top surface of the gate electrode 16 and on the TEOS side wall oxide films 20 as well as on the top surface of the silicon substrate 10. An ion-implantation process is carried out by using the gate electrode 16 and the TEOS side wall oxide films 20 as a mask to implant ions through the TEOS through oxide layer 22 into the silicon substrate 10. A rapid thermal annealing is carried out in a nitrogen atmosphere at a temperature of 1020° C. for 10 seconds, where a temperature rising rate is 100° C./sec for activation of the implanted ions into the silicon substrate, whereby source and drain regions 12 and 14 are formed in the silicon substrate 10. A knock-on phenomenon of carbon and oxygen and the rapid thermal annealing for activation to the implanted ions causes a Si—O—C based silicide reaction inhibitor layer 24 to be formed on an interface between the top surface of the gate electrode and the TEOS through oxide layer 22 and also on interfaces between the source and drain regions 12 and 14 and the TEOS through oxide layer 22.

The above processes are the same as the first and second embodiments and the conventional method. However, the following processes for removal of the TEOS through oxide layer 22 and the Si—O—C based silicide reaction inhibitor layer 24 and subsequent treatment prior to formation of a cobalt silicide layer are novel and different from the conventional method.

Figure 10:
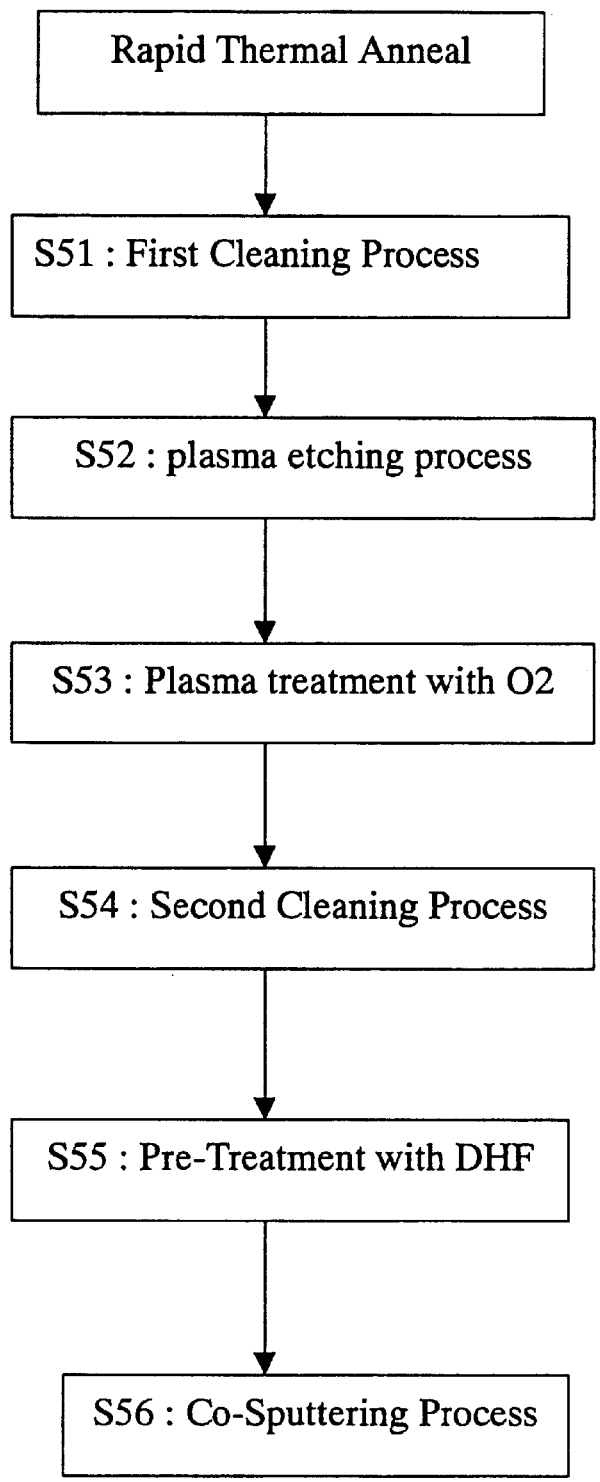
FIG. 10 is a flow chart explaining a novel process for removal of the TEOS through oxide layer and the Si—O—C based silicide reaction inhibitor layer and subsequent treatment prior to formation of a cobalt silicide layer in this sixth embodiment in accordance with the present invention.

FIG. 10 is a flow chart explaining a novel process for removal of the TEOS through oxide layer 22 and the Si—O—C based silicide reaction inhibitor layer 24 and subsequent treatment prior to formation of a cobalt silicide layer in this sixth embodiment in accordance with the present invention. A difference in process of this sixth embodiment from the third embodiment is only that the first cleaning process is so carried out by a wet etching not only to clean the top surface of the TEOS through oxide layer 22 but also to etch a surface portion of the TEOS through oxide layer 22, so as to shorten the time for carrying out the subsequent plasma etching process. The plasma etching is capable of etching not only the TEOS through oxide layer 22 and the silicidation reaction inhibitor layer 24 but also surface portions of the gate electrode 16 and the source and drain regions 12 and 14. Particularly when the source and drain regions 12 and 14 have extremely shallow p-n junctions for scaling down the semiconductor device, a long time plasma etching makes it difficult to surely prevent any substantive over-etching to the surface portions of the source and drain regions. In order to prevent such a long time plasma etching, the first cleaning process is so carried out to wet-etch surface portions of the TEOS through oxide layer 22.

After the rapid thermal annealing has been carried out for activation of the implanted ions to form the source and drain regions, then as a first step S51, a first cleaning process is carried out by use of any one of a sulfate-hydrogen peroxide solution and an ammonium-hydrogen peroxide solution so as not only to clean a surface of the TEOS through oxide layer 22 but also to wet-etch a surface portion of the TEOS through oxide layer 22.

In a second step S52, a dry etching process is carried out by use of a plasma with $CF_4+O_2$ mixture gases at a pressure of 1500 mTorr and a power of 100 W for five different time periods in the range of 30–120 seconds, wherein $O_2$ gas is used to control an etching rate and also to suppress deposition. The dry etching process causes the remaining portion of the TEOS through oxide layer 22 and the Si—O—C based silicide reaction inhibitor layer 24 to be removed from the top surfaces of the gate electrode 16 and the source and drain regions 12 and 14. Since the surface portion of the TEOS through oxide layer 22 has already removed in the previous cleaning process, the necessary time for removing the remaining part of the TEOS through oxide layer 22 is shortened. The plasma etching is capable of etching not only the TEOS through oxide layer 22 and the silicidation reaction inhibitor layer 24 but also surface portions of the gate electrode 16 and the source and drain regions 12 and 14. Even if the source and drain regions 12 and 14 have extremely shallow p-n junctions for scaling down the semiconductor device, a shortened time plasma etching makes it possible to surely prevent any substantive over-etching to the surface portions of the source and drain regions.

In a third step S53, the top surfaces of the gate electrode 16 and the source and drain regions 12 and 14 are subjected to a plasma treatment by use of the plasma etching system having used for the plasma etching process in the second step S52. The plasma treatment is carried out using $O_2$ plasma at a pressure of 1000 mTorr and a power of 1400 W for a time period of 20 seconds in order to remove contaminants such as polymer from the surfaces of the gate electrode 16 and the source and drain regions 12 and 14, wherein the contaminants such as polymer have been adhered by the previous dry etching process on the surfaces of the gate electrode 16 and the source and drain regions 12 and 14.

In a fourth step S54, a second cleaning process is carried out by use of any one of a sulfate-hydrogen peroxide solution and an ammonium-hydrogen peroxide solution, in order to clean the top surfaces of the gate electrode 16 and the source and drain regions 12 and 14.

In a fifth step S55, a previous treatment is carried out to further cleaning the top surfaces of the gate electrode 16 and the source and drain regions 12 and 14 by subjecting the top surfaces of the gate electrode 16 and the source and drain regions 12 and 14 to a diluted hydrofluoric acid solution of a dilution ratio of 1:100 for a time period of 60 seconds, whereby the structure shown in FIG. 2B is obtained.

In a sixth step S56, a cobalt-sputtering process is carried out by sputtering a cobalt target to entirely deposit a cobalt layer having a thickness of 100 angstroms onto a cleaned surface of the gate electrode 16, and on the TEOS side wall oxide films as well as on cleaned surfaces of the source and drain regions 12 and 14. This deposition process is carried out at a sputtering temperature in the range of 350–400° C. so as to cause a cobalt silicidation reaction thereby to form a cobalt silicide ($CoSi_2$) layer having a thickness of 300 angstroms on the cleaned top surfaces of the gate electrode 16 and the source and drain regions 12 and 14.

The plasma etching using the $CF_4+O_2$ mixture gases for at least 30 seconds or in a time period of not less than 30 seconds causes that the cobalt silicide layer has a sufficiently reduced sheet resistance and a sufficiently reduced variation in sheet resistance. A degree of variation of in sheet resistance of the cobalt silicide layer for individual conditions is not so different from each other. The dry etching process mentioned above causes a sufficient removal of the silicidation reaction inhibitor level from the surfaces of the gate electrode and the source and drain regions, thereby ensuring that a cobalt silicide layer having superior and desirable properties is formed on the surfaces of the gate electrode and the source and drain regions.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of removing a silicidation reaction inhibitor layer from a surface of a silicon region for subsequent silicidation reaction, said method comprising the steps of:
   forming a TEOS oxide film on a surface of the silicon region;
   carrying out an ion-implantation of impurities penetrating the TEOS film;
   carrying out a heat treatment for activation of the ion-implanted impurities; and
   carrying out a dry etching to said silicidation reaction inhibitor layer.

2. The method as claimed in claim 1, wherein said method further comprises the step of carrying out a cleaning process for cleaning the surface by subjecting said surface to an acidic solution after said silicidation reaction inhibitor layer has been removed by said dry etching process.

3. The method as claimed in claim 2, wherein any one of a sulfate-hydrogen peroxide solution and an ammonium-hydrogen peroxide solution is used as said acidic solution.

4. The method as claimed in claim 2, wherein said cleaning process further comprises the step of subjecting the surface to a diluted hydrofluoric acid solution after said surface has been subjected to said acidic solution.

5. The method as claimed in claim 1, wherein said dry etching comprises a plasma etching.

6. The method as claimed in claim 5, wherein said plasma etching is carried out by use of at least any one selected from the group consisting of $CF_4$, $C_2F_6$, $SF_6$ gases and mixture gases of $O_2$ with $CF_4$, $C_2F_6$, and $SF_6$.

7. The method as claimed in claim 5, wherein said method further comprises the step of subjecting the surface to an $O_2$ plasma after said silicidation reaction inhibitor layer has been removed by said dry etching process.

8. The method of claim 1, wherein the silicidation reaction inhibitor layer comprises an Si—O—C based material.

9. A method of removing laminations of a TEOS oxide film and a silicidation reaction inhibitor layer from a surface of a silicon region for subsequent cobalt silicidation reaction, said method comprising the steps of:
   forming a TEOS oxide film on a surface of the silicon region;
   carrying out an ion-implantation of impurities penetrating the TEOS film;
   carrying out a heat treatment for activation of the ion-implanted impurities; and
   carrying out a dry etching to said laminations of said TEOS oxide film and said silicidation reaction inhibitor layer.

10. The method as claimed in claim 9, wherein said method further comprises the step of carrying out a cleaning process for cleaning the surface by subjecting said surface to an acidic solution after said laminations of said TEOS oxide film and said silicidation reaction inhibitor layer have been removed by said dry etching process.

11. The method as claimed in claim 10, wherein any one of a sulfate-hydrogen peroxide solution and an ammonium-hydrogen peroxide solution is used as said acidic solution.

12. The method as claimed in claim 10, wherein said cleaning process further comprises the step of subjecting the surface to a diluted hydrofluoric acid solution after said surface has been subjected to said acidic solution.

13. The method as claimed in claim 9, wherein said dry etching comprises a plasma etching.

14. The method as claimed in claim 13, wherein said plasma etching is carried out by use of at least any one selected from the group consisting of $CF_4$, $C_2F_6$, $SF_6$ gases and mixture gases of $O_2$ with $CF_4$, $C_2F_6$, and $SF_6$.

15. The method as claimed in claim 13, wherein said method further comprises the step of subjecting the surface to an $O_2$ plasma after said laminations of said TEOS oxide film and said silicidation reaction inhibitor layer have been removed by said dry etching process.

16. The method of claim 9, wherein the silicidation reaction inhibitor layer comprises an Si—O—C based material.

17. A method of forming a cobalt silicide layer on a surface of a silicon region, said method comprising the steps of:
   forming a TEOS oxide film on a surface of the silicon region;
   carrying out an ion-implantation of impurities penetrating the TEOS film;
   carrying out a heat treatment for activation of the ion-implanted impurities; and
   carrying out a dry etching to remove laminations of the TEOS oxide film and a silicidation reaction inhibitor layer from a surface of said silicon region; and
   forming a cobalt silicide layer on said surface of said silicon region.

18. The method as claimed in claim 17, wherein said method further comprises the step of carrying out a cleaning process for cleaning the surface by subjecting said surface of said silicon region to an acidic solution after said laminations of said TEOS oxide film and said silicidation reaction inhibitor layer have been removed by said dry etching process and before said cobalt silicide layer is formed.

19. The method as claimed in claim 18, wherein any one of a sulfate-hydrogen peroxide solution and an ammonium-hydrogen peroxide solution is used as said acidic solution.

20. The method as claimed in claim 18, wherein said cleaning process further comprises the step of subjecting the surface to a diluted hydrofluoric acid solution after said surface has been subjected to said acidic solution.

21. The method as claimed in claim 17, wherein said dry etching comprises a plasma etching.

22. The method as claimed in claim 21, wherein said plasma etching is carried out by use of at least any one selected from the group consisting of $CF_4$, $C_2F_6$, $SF_6$ gases and mixture gases of $O_2$ with $CF_4$, $C_2F_6$, and $SF_6$.

23. The method as claimed in claim 21, wherein said method further comprises the step of subjecting the surface to an $O_2$ plasma after said laminations of said TEOS oxide film and said silicidation reaction inhibitor layer have been removed by said dry etching process and before said cobalt silicide layer is formed.

24. The method as claimed in claim 17, wherein the cleaning step is performed until not only said surface of said TEOS oxide film is cleaned but also a surface part of said TEOS oxide film is removed, before a remaining part of said TEOS oxide film and said silicidation reaction inhibitor layer are removed by said dry etching process.

25. The method of claim 17, wherein the silicidation reaction inhibitor layer comprises an Si—O—C based material.

26. A method of forming a cobalt silicide layer on a silicon region, said method comprising the steps of:
   forming a TEOS oxide film on a surface of said silicon region;
   carrying out an ion-implantation process for implanting ions through said TEOS oxide film into said silicon region;
   carrying out a heat treatment to activate said ions implanted in said silicon region, whereby a silicidation reaction inhibitor layer is concurrently formed on an interface between said TEOS oxide film and said surface of said silicon region;
   carrying out a dry etching to remove laminations of said TEOS oxide film and said silicidation reaction inhibitor layer from said surface of said silicon region;
   carrying out a cleaning process for cleaning the surface of said silicon region by subjecting said surface of said silicon region to an acidic solution and subsequently to a diluted hydrofluoric acid solution; and
   forming a cobalt silicide layer on said surface of said silicon region.

27. The method as claimed in claim 26, wherein any one of a sulfate-hydrogen peroxide solution and an ammonium-hydrogen peroxide solution is used as said acidic solution.

28. The method as claimed in claim 26, wherein said dry etching comprises a plasma etching.

29. The method as claimed in claim 28, wherein said plasma etching is carried out by use of at least any one selected from the group consisting of $CF_4$, $C_2F_6$, $SF_6$ gases and mixture gases of $O_2$ with $CF_4$, $C_2F_6$, and $SF_6$.

30. The method as claimed in claim 28, wherein said method further comprises the step of subjecting the surface to an $O_2$ plasma after said laminations of said TEOS oxide film and said silicidation reaction inhibitor layer have been removed by said dry etching process and before said cobalt silicide layer is formed.

31. The method as claimed in claim 26, wherein the cobalt silicide layer is defined by an insulation region.

32. The method of claim 26, wherein said method further comprises the step of an additional cleaning process by subjecting a surface of said TEOS oxide film to an additional acidic solution before said laminations of said TEOS oxide film and said silicidation reaction inhibitor layer are removed by said dry etching process.

33. The method as claimed in claim 32, wherein said surface of said TEOS oxide film so remains subjected to said additional acidic solution until not only said surface of said TEOS oxide film is cleaned but also a surface part of said TEOS oxide film is removed, before a remaining part of said TEOS oxide film and said silicidation reaction inhibitor layer are removed by said dry etching process.

34. The method of claim 32, wherein any one of a sulfate-hydrogen peroxide solution and an ammonium-hydrogen peroxide solution is used as said additional acidic solution.

35. A method of removing a silicidation reaction inhibitor layer from a surface of a silicon region for subsequent silicidation reaction, said method comprising the steps of:

forming a TEOS oxide film on a surface of the silicon region;

carrying out an ion-implantation of impurities penetrating the TEOS film;

carrying out a heat treatment for activation of the ion-implanted impurities;

cleaning a surface of an applied oxide layer through use of one of a sulfate-hydrogen peroxide solution and an ammonium-hydrogen peroxide solution;

following the cleaning step, performing a plasma etch step at a first power using a first gas mixture at a first pressure; and following the plasma etch step, performing a plasma treatment at a second power higher than the first power using a gas different from the first gas mixture at a second pressure lower than the first pressure.

36. The method of claim 35, wherein the cleaning, plasma etch, and plasma treatment steps are performed without intervening steps.

* * * * *